United States Patent
Bisby (10) Patent No.: US 9,444,416 B1
(45) Date of Patent: Sep. 13, 2016

(54) BROADBAND AMPLIFIER TOPOLOGY WITH CURRENT SHUTDOWN

(71) Applicant: MACOM Technology Solutions Holdings, Inc., Lowell, MA (US)

(72) Inventor: Ian M. Bisby, Douglas (IE)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 139 days.

(21) Appl. No.: 13/920,258

(22) Filed: Jun. 18, 2013

(51) Int. Cl.
*H03F 1/22* (2006.01)
*H03F 3/193* (2006.01)
*H01L 27/088* (2006.01)

(52) U.S. Cl.
CPC ........... *H03F 3/193* (2013.01); *H01L 27/0883* (2013.01); *H03F 1/22* (2013.01); *H03F 2200/294* (2013.01); *H03F 2200/61* (2013.01)

(58) Field of Classification Search
CPC .............. H03F 3/193; H03F 1/0277; H03F 2200/294; H03F 2200/451; H03F 2203/45506; H03F 3/45188; H03F 1/22; H03F 2203/45302; H03F 2203/7236; H03F 1/523; H03F 2003/45008; H03F 2203/7215; H03F 2203/7221; H03F 2200/61; H03F 1/223; H03F 2200/372; H03F 3/72; H01L 29/2003; H01L 29/1608; H01L 27/098; H01L 29/808; H01L 29/8083; H01L 29/861; H01L 29/868; H01L 29/872; H01L 29/0619; H01L 29/8122; H01L 29/8124; H01L 29/8086; H01L 27/0605; H01L 27/062; H01L 27/0883; H03G 1/0088

USPC .................................................... 330/51, 311
See application file for complete search history.

(56) References Cited

U.S. PATENT DOCUMENTS

| | | | |
|---|---|---|---|
| 7,397,309 B2 * | 7/2008 | Tanoi | 330/311 |
| 7,619,482 B1 * | 11/2009 | Kobayashi | H03F 3/193 330/310 |
| 8,228,114 B1 | 7/2012 | Cilio | 327/430 |
| 8,279,008 B2 * | 10/2012 | Hsieh | H03F 1/223 330/285 |
| 8,502,323 B2 * | 8/2013 | Chen | H01L 29/7786 257/392 |
| 2005/0212603 A1 * | 9/2005 | Aoki | 330/311 |
| 2006/0119435 A1 * | 6/2006 | Oh et al. | 330/311 |
| 2013/0009165 A1 * | 1/2013 | Park | H01L 21/8252 257/76 |

OTHER PUBLICATIONS

Tsironis, Christos, et al. "DC Characteristics Aid Dual-Gate FET Analysis", Microwaves, Jul. 1981, pp. 71-73.

* cited by examiner

*Primary Examiner* — Khanh V Nguyen
(74) *Attorney, Agent, or Firm* — Christopher P. Maiorana, PC (57) ABSTRACT

An apparatus includes a first depletion-mode transistor, a first enhancement-mode transistor, and a pull down switch. The first depletion-mode transistor has a common source configuration. The first enhancement-mode transistor has a common gate configuration. The first depletion-mode transistor and the first enhancement-mode transistor are coupled in a cascode arrangement. The pull down switch is operatively coupled between a gate of the enhancement-mode transistor and a circuit ground.

20 Claims, 10 Drawing Sheets

BROADBAND AMPLIFIER TOPOLOGY WITH CURRENT SHUTDOWN

FIELD OF THE INVENTION

The present invention relates to low-power amplifier topology generally and, more particularly, to a method and/or apparatus for implementing a broadband amplifier topology with current shutdown.

BACKGROUND OF THE INVENTION

A shut down function is desirable in some applications to shut down (or significantly reduce) the DC current drawn by an amplifier by applying a control voltage to a control pin. The shut down function could be used during standby operation of a set-top-box, for example, so that the overall power consumption of a system is reduced. The shut down function is becoming more desirable for so-called "green" products.

SUMMARY OF THE INVENTION

The present invention concerns an apparatus including a first depletion-mode transistor, a first enhancement-mode transistor, and a pull down switch. The first depletion-mode transistor has a common source configuration. The first enhancement-mode transistor has a common gate configuration. The first depletion-mode transistor and the first enhancement-mode transistor are coupled in a cascade arrangement. The pull down switch is operatively coupled between a gate of the enhancement-mode transistor and a circuit ground.

The objects, features and advantages of the present invention include providing a broadband amplifier topology with current shutdown that may (i) use only positive voltages to operate the topology by using an enhancement-mode field effect transistor (FET) to control current shutdown, (ii) use a high-yielding depletion-mode common source FET to eliminate on-chip bias regulation; (iii) provide improved bandwidth and match relative to conventional common source topology, and/or (iv) be fabricated using an enhancement/depletion (E/D) psuedomorphic high electron mobility transistor (pHEMT) process.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
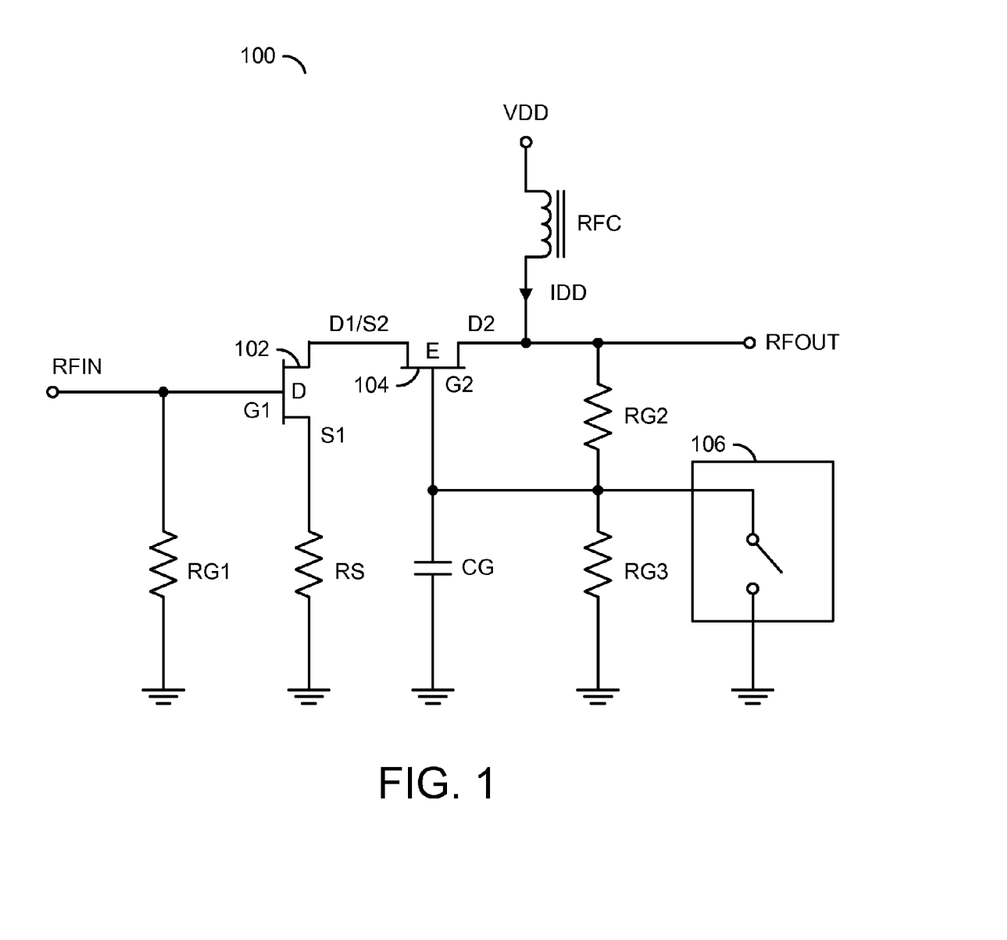
FIG. 1 is a diagram illustrating a cascode topology broadband amplifier with current shutdown in accordance with an embodiment of the invention.

Referring to FIG. 1, a diagram of a circuit 100 is shown illustrating a cascode amplifier topology in accordance with an embodiment of the present invention. The circuit 100 comprises a depletion-mode field effect transistor (FET) 102, an enhancement-mode FET 104 and a pull down switch 106. The depletion-mode FET 102 is arranged in a common source (CS) configuration. The enhancement-mode FET 104 is arranged in a common gate (CG) configuration. The depletion-mode FET 102 and the enhancement-mode FET 104 are coupled in a cascode arrangement. The pull down switch 106 is connected to a gate of the enhancement-mode FET 104. The pull down switch 106 is configured to allow a drain current (e.g. IDD) to be shut down in response to application of a positive control voltage. In various embodiments, a resistor (e.g., RG1) and a resistor (e.g., RS) are configured to provide a passive self-bias circuit on the depletion-mode FET 102. A resistor (e.g., RG2) and a resistor (e.g., RG3) are configured to provide a passive potential divider circuit to bias the enhancement-mode FET 104. The passive bias circuits are just one example, but other bias circuits could be used.

A common source FET amplifier is bandwidth-limited by a pole created by the input capacitance and some resistance at, or near, the input such as a feedback resistor, source resistance $Z_0$, etc. That part of the input capacitance which is due to the intrinsic feedback capacitance, $C_{gd}$, is proportional to the voltage gain of the FET—the well known Miller effect. In the cascode arrangement, shown in FIG. 1, the common gate FET (e.g., transistor 104) presents a low impedance to the common source FET (e.g., transistor 102) which results in a low voltage gain for the common source FET (in comparison to the voltage gain that the common source FET would have if connected to a system load impedance of 50 or 75 ohm, for example). The lower voltage gain reduces the Miller effect and, therefore, the input capacitance. The reduced input capacitance results in an increased pole frequency and a broader bandwidth performance. Variation of the drain current IDD over process of a cascode FET topology is determined by the characteristics of the common source FET; the characteristics of the common gate FET are relatively insignificant (assuming a high output resistance for both the common source and common gate FETs).

Figure 2:
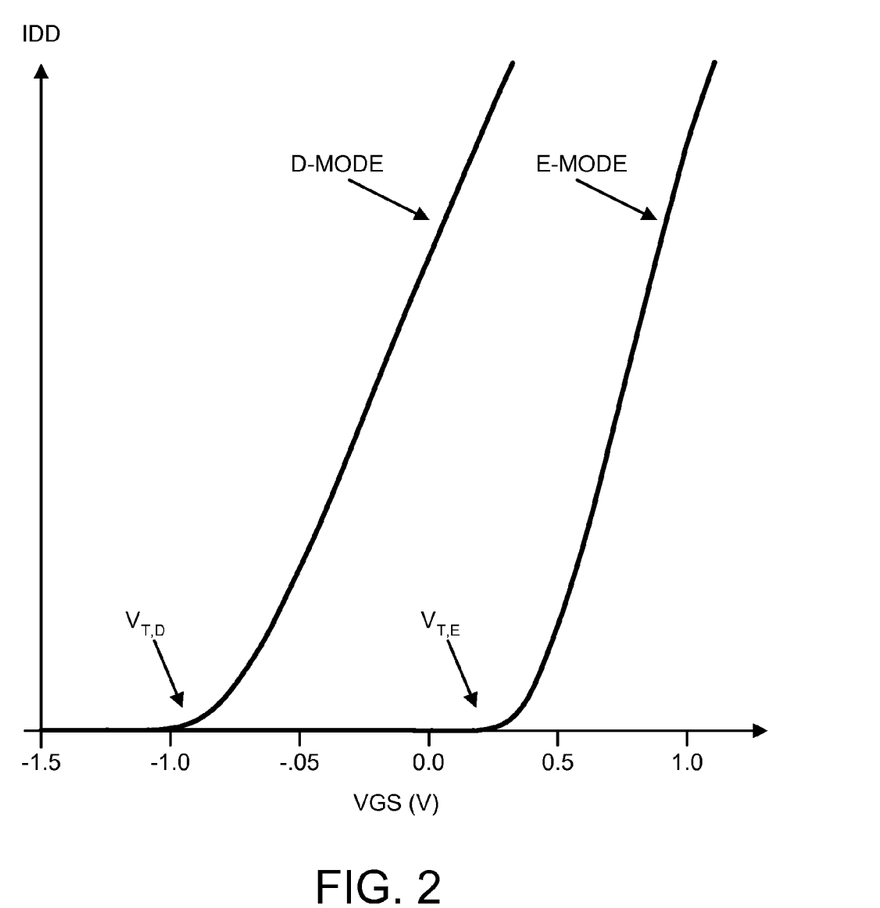
FIG. 2 is a diagram illustrating a comparison of enhancement-mode and depletion-mode DC currents vs. gate-source voltage (fixed drain-source voltage)

Referring to FIG. 2, a diagram is shown illustrating a curve D-MODE and a curve E_MODE representing typical plots of the DC drain current, IDD, of a depletion-mode FET and an enhancement-mode FET, respectively. The threshold voltage of a depletion-mode FET, $V_{T,D}$, is negative. The threshold voltage an enhancement-mode FET, $V_{T,E}$, is positive. As is apparent from FIG. 2, an enhancement-mode FET can be shut down by applying zero volts to the gate. Referring back to FIG. 1, the pull down switch 106 connected between the gate of the enhancement-mode transistor 104 and the circuit ground pulls down the gate voltage of the enhancement-mode transistor 104 to zero volts, which shuts down the enhancement-mode transistor 104. Embodiments of the present invention generally combine the simple, positive-voltage shutdown capabilities of an enhancement-mode FET with the high-yielding, unregulated benefits of the depletion-mode FET in a broad bandwidth cascode topology.

Figure 3:
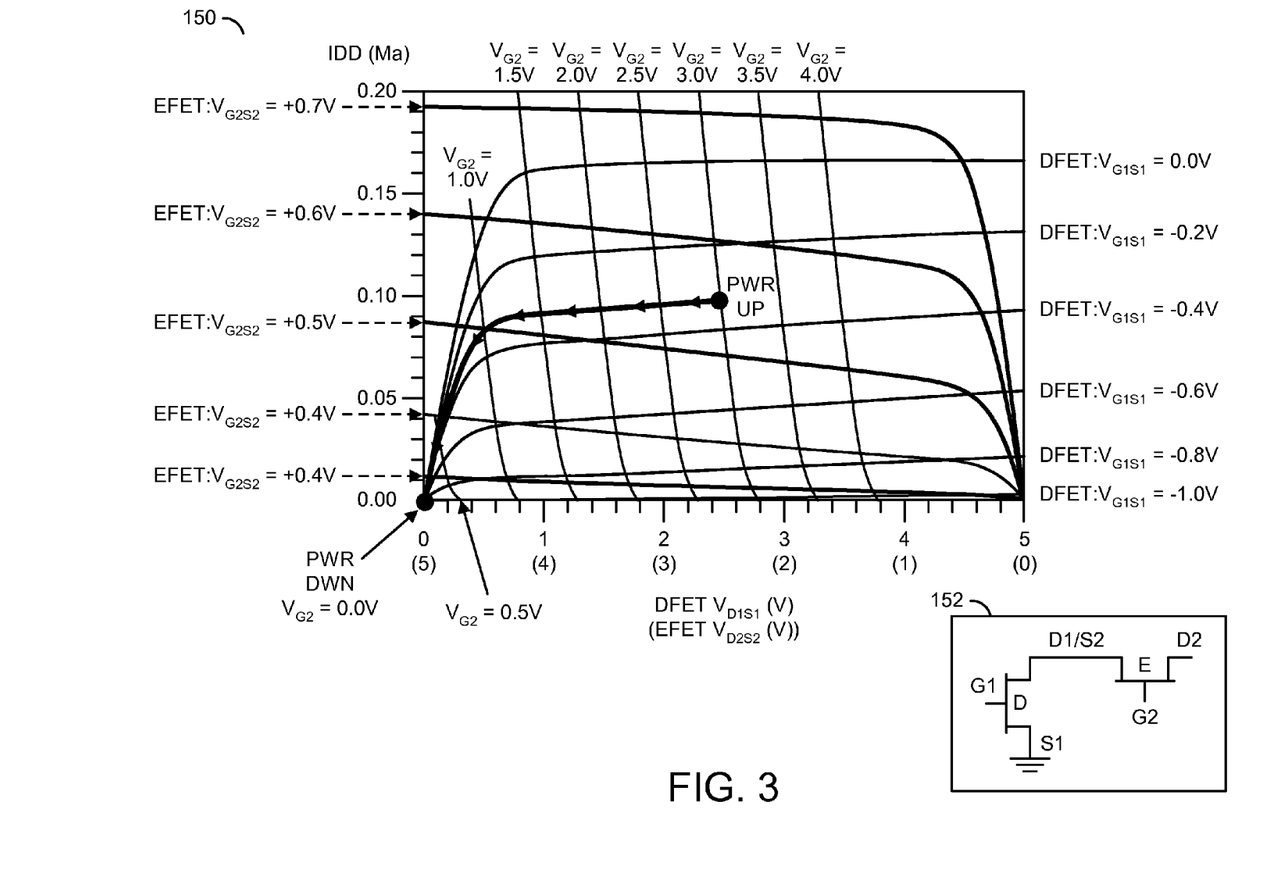
FIG. 3 is a graph illustrating current vs. voltage (IV) curves of a common source depletion-mode FET and a common gate enhancement-mode FET.

Referring to FIG. 3, a graph 150 is shown illustrating current vs. voltage (IV) curves of a common source depletion-mode FET and a common gate enhancement-mode FET. The graph 150 may be used in determining cascode bias conditions of a cascode amplifier topology in accordance with an embodiment of the present invention. In various embodiments, a cascode topology amplifier comprises a depletion-mode FET for the common source (CS) transistor and an enhancement-mode FET for the common gate (CG) transistor. To shut down the cascode topology amplifier, a pull down switch circuit is attached to the gate of the common gate enhancement-mode FET as shown in FIG. 1. The manner in which the shut down switch circuit works for the cascode topology amplifier may be explained with reference to the following Kirchoff equations (1) and (2):

$$V_{D2S1} = V_{D1S1} + V_{D2S2} \quad \text{EQ. 1}$$

$$V_{D1S1} = V_{G2} - V_{G2S2} \quad \text{EQ. 2}$$

Equations 1 and 2 are derived from a simplified version of the cascade amplifier topology shown in FIG. 1 (shown as inset 152 in FIG. 3), where the resistance RS is presumed to be zero.

From Equation 1, only $V_{D2S1}$ is known (e.g., VDD). In an example where VDD is 5V, Equation 1 can be graphically represented as shown in FIG. 3 by plotting the IV curves of the common source depletion-mode FET and common gate enhancement-mode FET on the same graph—the $V_{DS}$ axis is reversed for the common gate enhancement-mode FET. The total voltage across both FETs adds to 5 V (for the example where VDD=5V), which can be seen on the graph 150 with increasing $V_{DS}$ for the depletion-mode FET and decreasing $V_{DS}$ for the enhancement-mode FET. Additional information for determining the individual drain-source voltages can be derived using Equation 2.

Equation 2 is represented on the graph 150 for increments of $V_{G2}$, which is a known voltage set by either a potential divider in power-up mode or the low impedance pull-down switch circuit in power-down mode. The specific operating voltages of the cascade topology amplifier can be graphically read off the graph 150. For example, for a $V_{G2}$ of 3.0 V, a $V_{G1S2}$ of −0.3 V bias point can be read off the graph 150 (labeled as "PWR UP"), where the drain-source voltages of both FETs are approximately equal at 2.5 V each and the total drain current is 100 mA. It can be seen that as the pull-down circuit reduces $V_{G2}$ to zero (illustrated by the direction of the arrowheads) the total drain current drops to zero and the amplifier is powered down (labeled as "PWR DWN").

Figure 4:
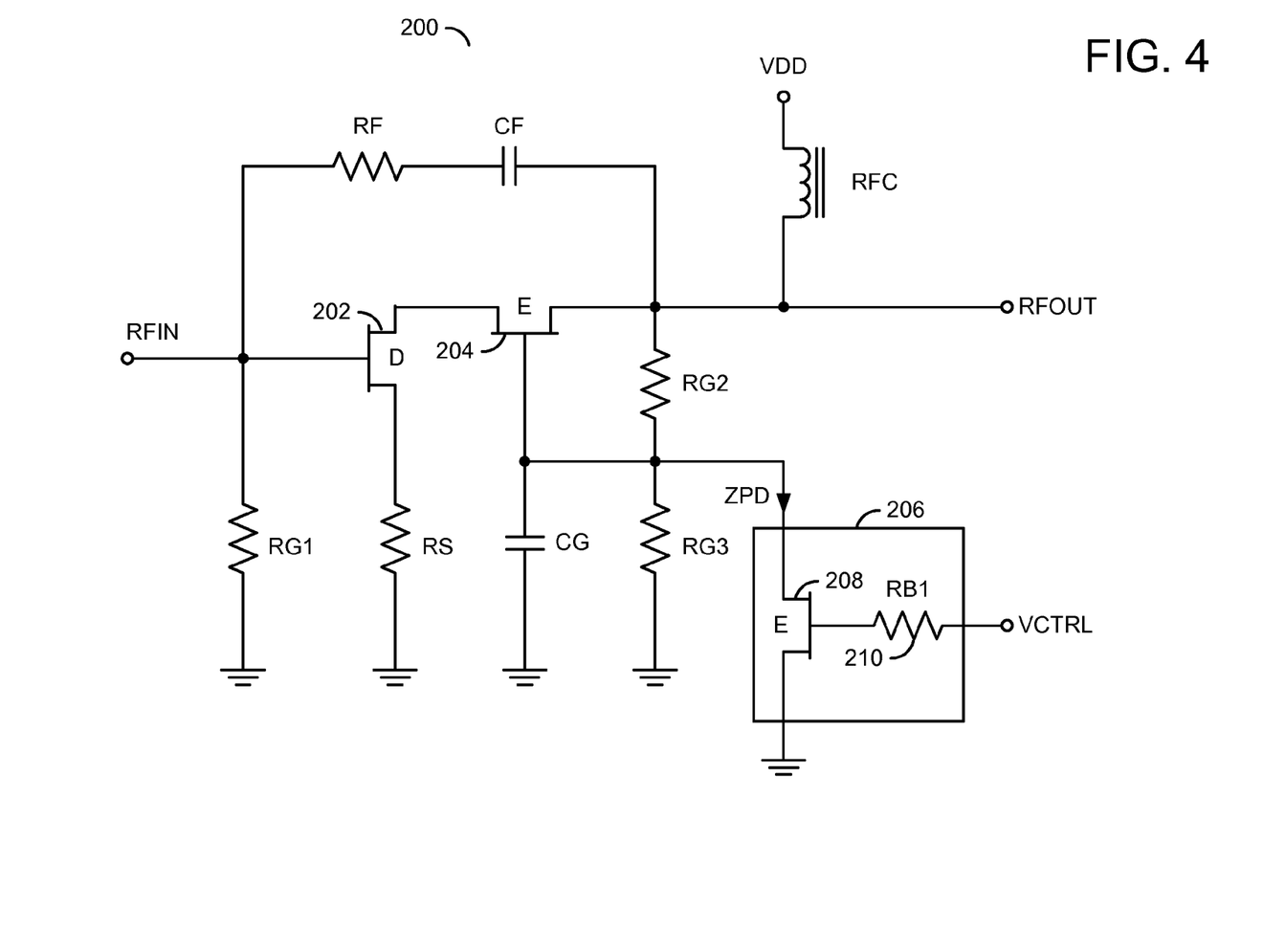
FIG. 4 is a diagram illustrating a cascode topology broadband amplifier with an enhancement-mode pull down switch in accordance with an embodiment of the invention.

Referring to FIG. 4, a diagram of a circuit 200 is shown illustrating a cascode topology broadband amplifier with an enhancement-mode pull down switch in accordance with an embodiment of the invention. The circuit 200 comprises a depletion-mode' transistor 202, an enhancement-mode transistor 204 and a pull down switch circuit 206. The circuit 200 is implemented similarly to the circuit 100 of FIG. 1, except that a feedback path comprising a resistor RF and a DC blocking capacitor CF is added and the pull down switch 106 is replaced with the simple pull down switch circuit 206 comprising an enhancement-mode FET 208 and a large resistor 210 having a value RB1. The resistor 210 is connected to the gate of the enhancement-mode FET 208 to limit the gate current when a control signal (e.g., VCTRL) is HIGH. A pull down impedance (e.g., ZPD) of the pull down switch circuit 206 is low when the control signal VCTRL is HIGH. A cascode topology amplifier implemented with the circuit 200 will therefore be in shutdown mode when the control signal VCTRL is HIGH.

Figure 5:
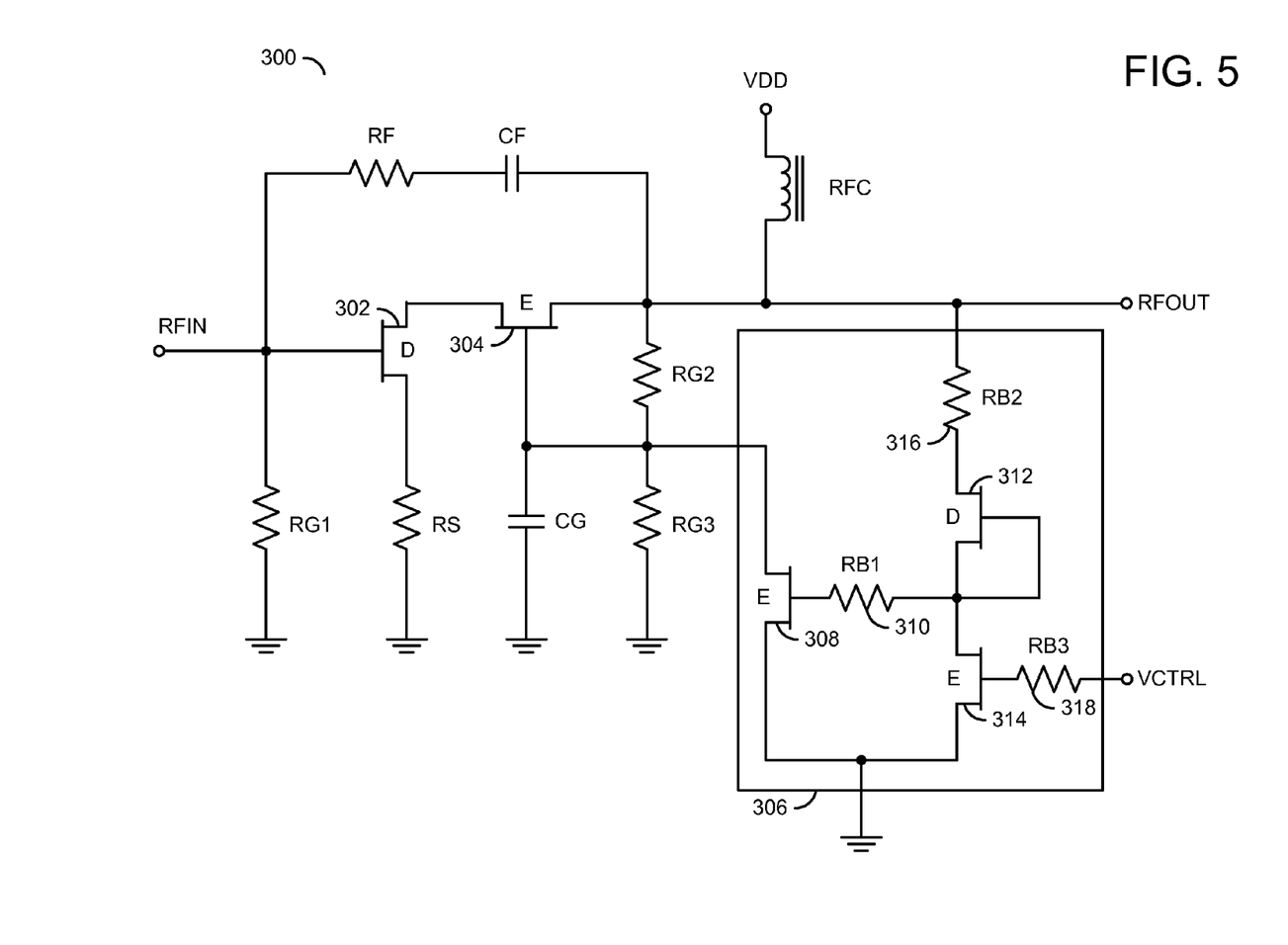
FIG. 5 is a diagram illustrating a cascode topology broadband amplifier with an inverter-based pull down switch.

Referring to FIG. 5, a diagram of a circuit 300 is shown illustrating a cascode topology broadband amplifier with an inverter-based enhancement-mode pull down switch in accordance with an embodiment of the invention. The circuit 300 comprises a depletion-mode transistor 302, an enhancement-mode transistor 304 and a pull down switch circuit 306. The circuit 300 is implemented similarly to the circuit 200 of FIG. 4, except that the pull down switch circuit 206 is replaced with the inverter-based enhancement-mode pull down switch circuit 306. Similar to pull down switch circuit 206, the inverter-based enhancement-mode pull down switch circuit 306 comprises an enhancement-mode FET 308 and a resistor 310 having a resistance value RB1 connected to the gate of the enhancement-mode FET 208. The resistance value RB1 is chosen large enough to limit the gate current. However, when the shutdown mode is to be controlled by the signal VCTRL having a LOW level, an on-chip inverter circuit is added comprising a depletion-mode current source 312 (e.g., a depletion-mode transistor with gate and source connected) and an enhancement-mode switch 314 which are both connected to the enhancement-mode pull down switch 308 via the resistor 310. A resistor 316 is connected to the depletion-mode current source 312. The resistor 316 has a resistance value RB2, which is large enough to limit the gate current of the depletion-mode current source 312. A resistor 318 is connected to the enhancement-mode transistor 314. The resistor 318 has a resistance value RB3, which is large enough to limit the gate current of the enhancement-mode transistor 314. Electrostatic discharge (ESD) protection can be added to the pull down switch circuit also (not shown). Both the circuit 200 (shown in FIG. 4) and the circuit 300 (shown in FIG. 5) are shown configured as feedback amplifiers with a feedback resistor, RF, and a DC blocking capacitor, CF, in the feedback path.

Figure 6:
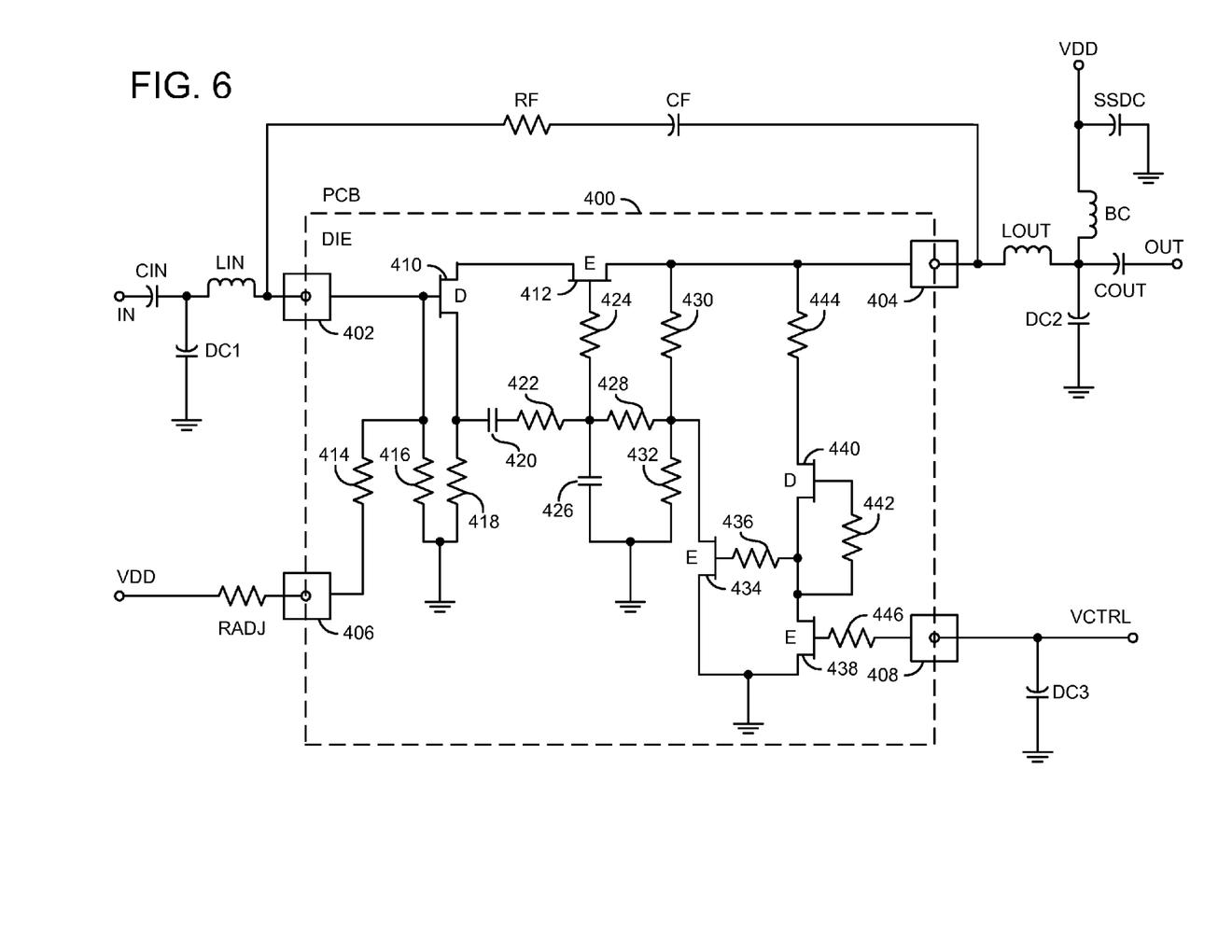
FIG. 6 is a diagram illustrating on-chip and off-chip components of an example implementation of the amplifier of FIG. 5.

Referring to FIG. 6, a diagram of an integrated circuit 400 is shown illustrating on-chip and off-chip components of an example implementation of an amplifier using the cascode topology of FIG. 5. In various embodiments, the integrated circuit (IC) 400 may implement a 50 MHz-2.7 GHz low cost, low distortion and low noise cascode topology amplifier. The integrated circuit 400 may be utilized in, for example, broadcast applications. The integrated circuit 400 may be implemented on a monolithic microwave integrated circuit (MMIC) fabricated using an enhancement/depletion (E/D) psuedomorphic high electron mobility transistor (pHEMT) process. Such a process is commercially available.

Amplifiers designed for the North American and European cable TV (CATV) markets are typically designed for 50 MHz-1 GHz operation. The extended bandwidth provided by the cascode amplifier topology in accordance with the present invention allows the integrated circuit 400 to be used in other markets (e.g., the Japanese market) as well. A power-down function is also provided. The power-down function significantly reduces the drain current when the control signal VCTRL is asserted (e.g., LOW in the configuration shown in FIG. 6), effectively turning the amplifier OFF. When the control signal VCTRL is de-asserted (e.g., HIGH in the configuration shown in FIG. 6), the amplifier is placed in a normal operating state. In various embodiments, the normal operating state may provide, for example, 15 dB of gain and 100 mA of current. The power-down function significantly reduces the power dissipation when, for example, a set-top-box (STB) is in standby mode.

In one example, the integrated circuit 400 may comprise a pad (or pin) 402, a pad (or pin) 404, a pad (or pin) 406, and a pad (or pin) 408. The pad 402 may receive an input signal to the amplifier. The pad 404 may present an output signal from the amplifier. The pad 406 may be configured as a bias control input. The pad 408 may be configured as a power down control input. In one example, an input signal may be coupled to the pad 402 via an input network comprising an input capacitor (e.g., CIN), an input inductor (e.g., LIN) and a decoupling capacitor (e.g., DC1). In one example, the input inductor LIN may have an inductance of about 4 nano-Henries (nH), the input capacitor CIN may have a capacitance ranging from about 50 picofarad (pF) to about 10 nanofarad (nF), the decoupling capacitor DC1 may have a capacitance of about one-half pF. The input pad 402 may be coupled to the output pad 404 via a feedback network comprising a feedback resistor RF and a DC blocking capacitor CF. The output pad 404 may be coupled to an output lead (or terminal) OUT via an output network. The output network may be coupled to a power supply voltage (e.g., VDD) as well.

In one example, the output network may comprise an output inductor (e.g., LOUT), an output capacitor (e.g., COUT), a decoupling capacitor DC2, a bias choke BC and a supply-side decoupling capacitor SSDC. The output pad 404 may be connected to a first terminal of the output inductor LOUT. A second terminal of the output inductor LOUT may be connected to a first terminal of the output capacitor COUT, a first terminal of the decoupling capacitor DC2, and a first terminal of the bias choke BC. A second terminal of the output capacitor COUT may be connected to the output lead (or terminal). A second terminal of the decoupling capacitor DC2 may be connected to a circuit ground. A second terminal of the bias choke may be connected to a first terminal of the supply-side decoupling capacitor SSDC and the power supply voltage. In one example, the bias choke BC may be implemented as a ferrite bead (FB) bias choke. In one example, the output inductor LOUT may have an inductance of about 4 nano-Henries (nH), the output capacitor COUT may have a capacitance ranging from about 50 pF to about 10 nF, the decoupling capacitor DC2 may have a capacitance of about one-half pF, and the supply-side decoupling capacitor may have a capacitance ranging from about 10 nF to more than 1 microfarad (µF). In one example, the supply-side decoupling capacitor SSDC may be implemented as one or more capacitors.

In one example, the bias input pad 406 may be connected directly to the power supply voltage VDD. In another example, the bias input pad 406 may be connected to the power supply voltage VDD via a resistor (e.g., RADJ). In one example, the resistor RADJ may be implemented having a resistance of several hundred kiloohms (kΩ). In some embodiments, the resistor RADJ may be implemented as a variable resistor to allow fine tuning of a DC bias point within the integrated circuit 400 in order to set an optimum DC current for distortion. The control signal VCTRL may be presented directly to the pad 408. A decoupling capacitor DC3 may be used to reduce noise on the control pad 408. In one example, the decoupling capacitor DC3 may have a capacitance of about 10 nF.

In some embodiments, the integrated circuit 400 may comprise a depletion-mode transistor 410, an enhancement-mode transistor 412, a number of resistive elements (e.g., resistors 414-418, 422, 424, and 428-446), a number of capacitive elements (e.g., capacitors 420 and 426), an enhancement-mode transistor 434, the depletion-mode transistor 440 and an enhancement-mode transistor 438. The transistors 410, 412, 434, 438 and 440 may be implemented as field effect transistors (FETs). In one example, the transistors 410, 412, 434, 438 and 440 may be fabricated using an enhancement/depletion (E/D) psuedomorphic high electron mobility transistor (pHEMT) process. Such a process is commercially available. The resistive elements 414, 416, 428, 430, 432, 436, 438, 444 and 446 generally have resistances measured in kΩ. The resistive elements 418, 422, 424, and 442 generally have resistances measured in ohms. The capacitive elements 420 and 426 generally have capacitances measured in picofarads.

The depletion-mode transistor 410 is connected in series with the enhancement-mode transistor 412. The depletion mode transistor 410 is arranged in a common source configuration. The enhancement-mode transistor 412 is arranged in a common gate configuration. The transistor 410 and the transistor 412 are coupled in a cascode arrangement. The input pad 402 may be connected to a gate of the transistor 410, a first terminal of the resistive element 414, and a first terminal of the resistive element 416. A second terminal of the resistive terminal 414 may be connected to the pad 406. A second terminal of the resistive terminal 416 may be connected to a circuit ground. A source of the transistor 410 may be connected to a first terminal of the resistive element 418 and a first terminal of the capacitive element 420. A second terminal of the resistive element 418 may be connected to the circuit ground. A second terminal of the capacitive element 420 may be connected to a first terminal of the resistive element 422. A drain of the transistor 410 may be connected to a source of the transistor 412. A drain of the transistor 412 is connected to the output pad 404. A gate of the transistor 412 is connected to a first terminal of the resistive element 424. A second terminal of the resistive element 424 is connected to a second terminal of the resistive element 422, a first terminal of the capacitive element 426, and a first terminal of the resistive element 428. A second terminal of the capacitive element 426 is connected to the circuit ground. A second terminal of the resistive element 428 is connected to a first terminal of the resistive element 430 and a first terminal of the resistive element 432. A second terminal of the resistive element 430 is connected to the drain of the transistor 412. A second terminal of the resistive element 432 is connected to the circuit ground.

The integrated circuit 400 further comprises a shutdown circuit formed by the enhancement-mode transistor 434, the depletion-mode transistor 440 and the enhancement-mode transistor 438. A drain of the enhancement-mode transistor 434 is connected to a node formed by the connected terminals of the resistive elements 428, 430 and 432. A source of the enhancement-mode transistor 434 is connected to the circuit ground. A gate of the enhancement-mode transistor 434 is connected to a first terminal of the resistive element 436. A second terminal of the resistive element 436 is connected to a drain of the enhancement-mode transistor 438, a source of the depletion-mode transistor 440, and a first terminal of the resistive element 442. A gate of the depletion-mode transistor 440 is connected to a second terminal of the resistive element 442. A source of the depletion-mode transistor 440 is connected to a first terminal of the resistive element 444. A second terminal of the resistive element 444 is connected to the pad 404. A source of the enhancement-mode transistor 438 is connected to the circuit ground. A gate of the enhancement-mode transistor 438 is connected to a first terminal of the resistive element 446. A second terminal of the resistive element 446 is connected to the pad 408.

The depletion-mode FET 410 is biased using a resistive potential divider, formed by the resistive elements 414 and 416 (and RADJ when implemented), on the gate and a self bias resistor (element 418) on the source (which also provides RF resistance for setting the return losses and gain). Some of the resistance of the potential divider may be left off-chip (e.g., RADJ) to allow fine tuning of the DC bias point in order to set the optimum DC current for distortion. The feedback resistor RF and input-to-output DC blocking capacitor CF are placed off-chip to reduce die size. For example, a DC blocking capacitor having a capacitance of several 10 s of picofarads (pF) is generally used, which would occupy a significant percentage of the die. Although some CATV amplifiers with a 50 MHz-1 GHz bandwidth can be designed with gains greater than 20 dB, the extended bandwidth in this case generally allows a reduced gain of approximately 15 dB. The extended bandwidth is achieved by reducing the value of feedback resistor RF which increases the dominant pole frequency up to 2.7 GHz. It is also important to minimize the FET periphery in order to minimize the input capacitance and maximize the bandwidth. However, the minimum FET periphery is dictated by the distortion specification. The initial bias point may be chosen based on distortion simulations (e.g., performed in ADS from Agilent Technologies) where the pinch-off voltage of both the depletion-mode FET and the enhancement-mode FET are varied over the full process range and the optimum gate voltages were determined.

In some embodiments, measured return loss versus output DC blocking capacitance (e.g., $s_{11}$ and $s_{22}$ parameters) of the amplifier of FIG. 6 at 50 MHz were in a range from −10 dB to >−18 dB from 50 pf to 10 nano-Farads (nF). In some embodiments, optimum return losses may be achieved for output DC blocking capacitor (COUT) values of ~200 pF. Measuring $s_{11}$ and $s_{22}$ versus the input DC blocking capacitance (CIN), the return loss improves with increasing values of capacitance. Based on measured results, an input DC blocking capacitance of ~10 nF provided optimum return losses.

Figure 7:
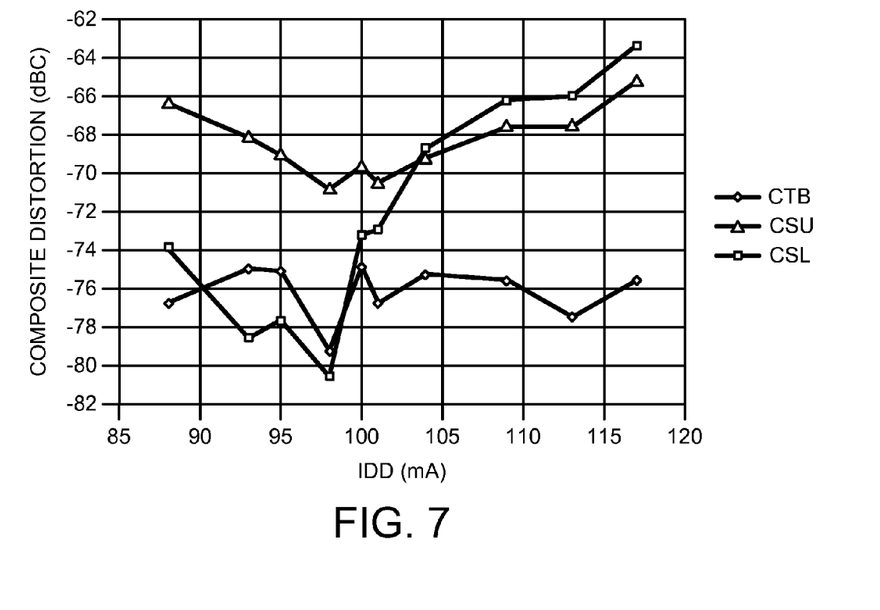
FIG. 7 is a diagram illustrating measured composite distortion (worst case across frequency) plotted against drain current.

Referring to FIG. 7, a diagram illustrating measured composite distortion (worst case across frequency) plotted against drain current is shown. The off-chip current adjust resistor, RADJ in FIG. 6, is used to vary the DC drain current in order to find an optimum bias point that minimizes the composite distortion. The optimum bias current can be seen to be between 95-100 mA. The composite distortion was measured using 79 channels with an input power of +15 dBmV/ch.

Figure 8:
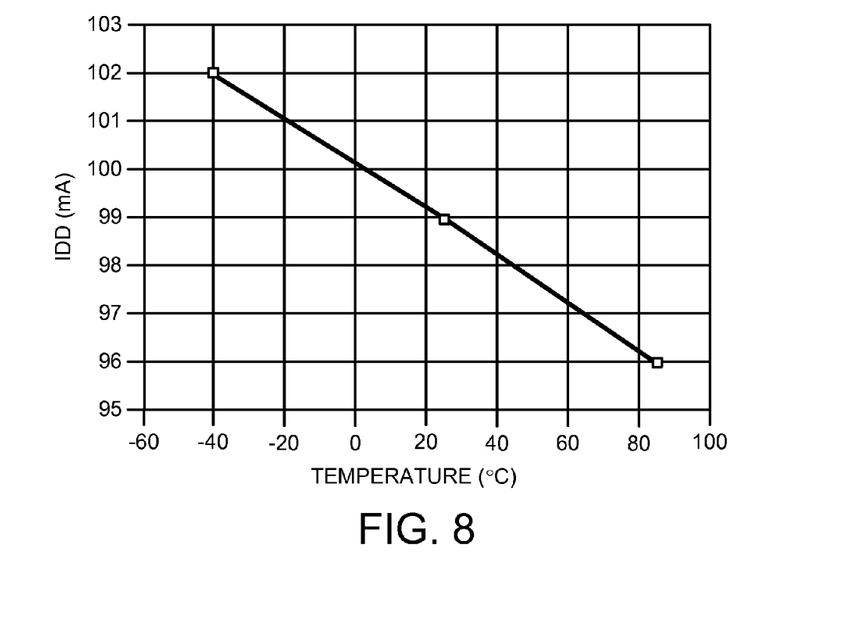
FIG. 8 is a diagram illustrating measured drain current plotted against temperature.

Referring to FIG. 8, a diagram illustrating measured drain current plotted against temperature is shown. IN one example, the drain current IDD may vary by +/−3 mA from room temperature over a temperature range −40° C. to +85° C.

Figure 9:
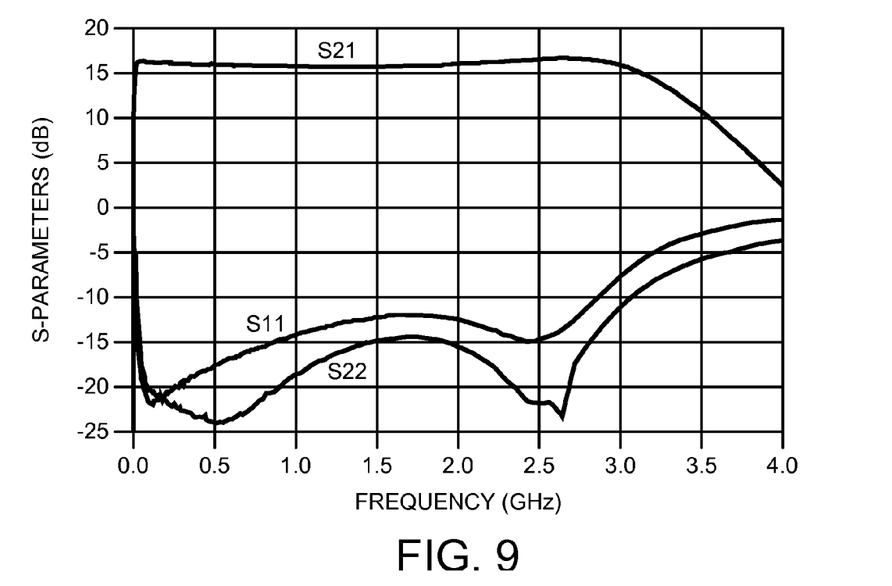
FIG. 9 is a diagram illustrating measured s-parameters at room temperature.

Referring to FIG. 9, a diagram illustrating measured s-parameters at room temperature is shown. The gain is greater than 15 dB across the full band of 50 MHz to 2.7 GHz. The output return loss meets a minimum specification of 14 dB but the input return loss has a worst case value of 12 dB across the band. This is acceptable for some applications but if an improvement is needed then the amplifier can be re-matched for narrower band operation depending on the specifications of the customer.

Figure 10:
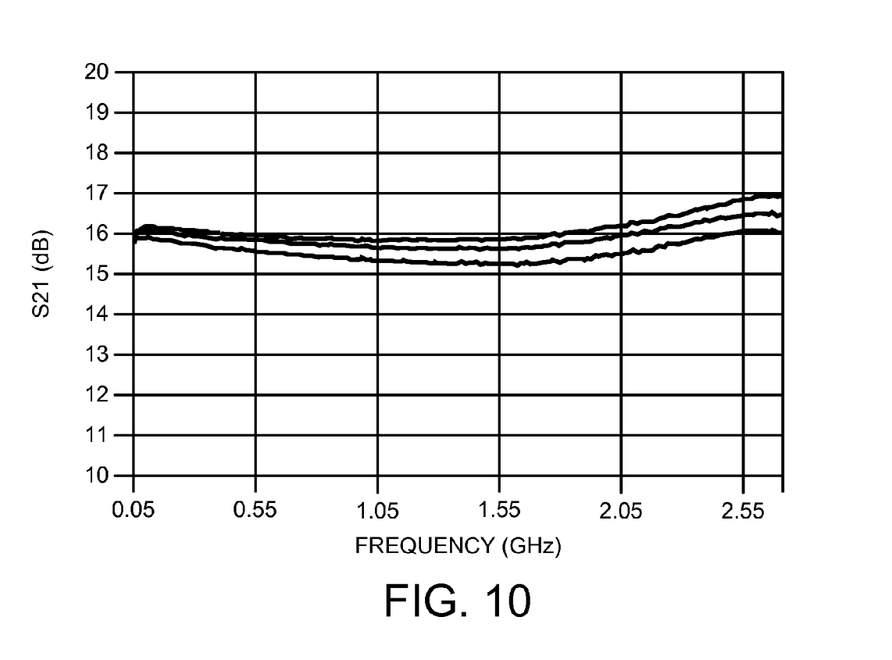
FIG. 10 is a diagram illustrating measured gain over temperature.

Referring to FIG. 10, a diagram illustrating measured gain over temperature is shown. The top curve represents a temperature of −40° C., the middle curve represents a temperature of +25° C., and the lower curve represents a temperature of +85° C.

Figure 11:
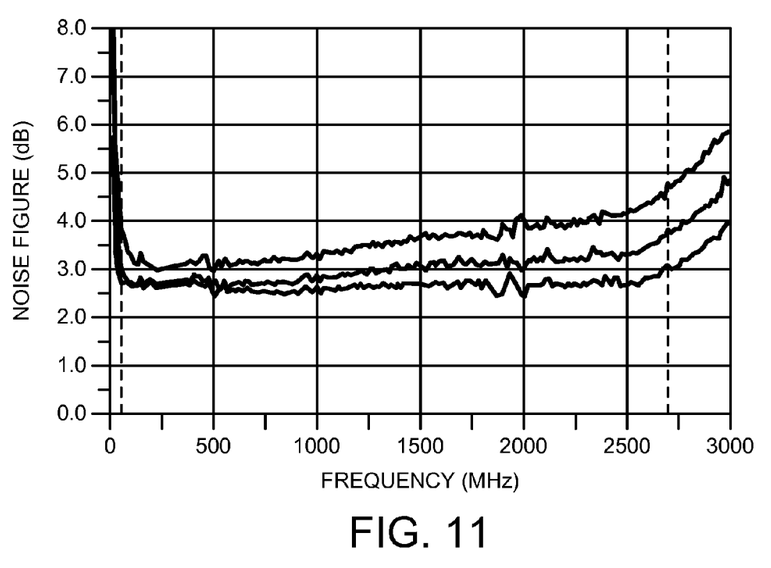
FIG. 11 is a diagram illustrating measured noise figure over temperature.

Referring to FIG. 11, a diagram illustrating measured noise figure over temperature is shown. The lower curve represents a temperature of −40° C., the middle curve represents a temperature of +25° C., and the top curve represents a temperature of +85° C.

Figure 12:
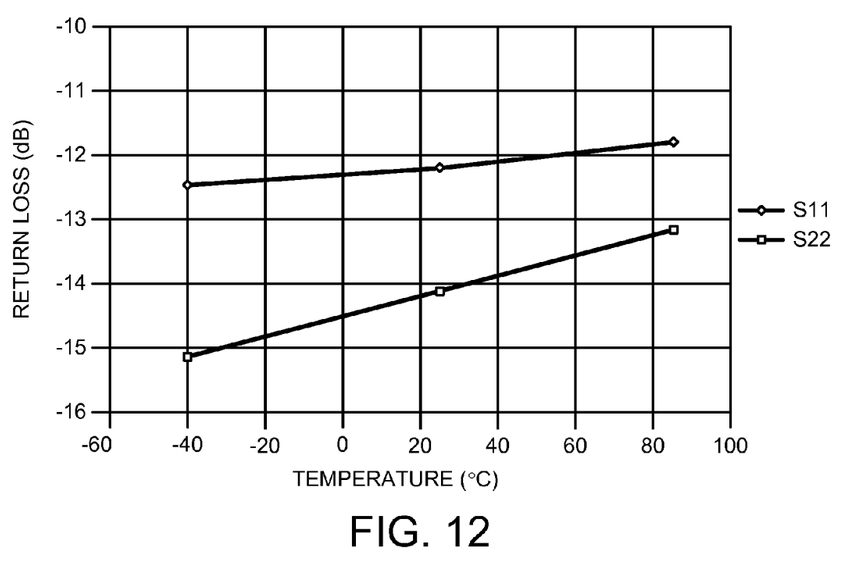
FIG. 12 is a diagram illustrating worst case return losses over the full frequency range plotted against temperature.

Referring to FIG. 12, a diagram illustrating worst case return losses over the full frequency range plotted against temperature is shown.

Figure 13:
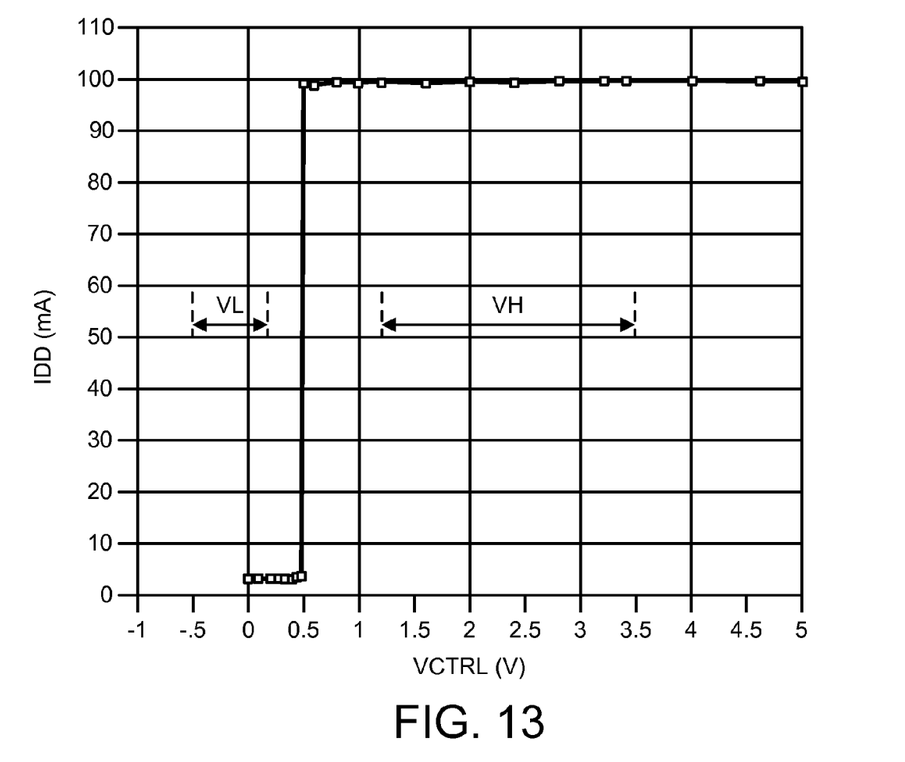
FIG. 13 is a diagram illustrating measured drain current plotted against control voltage.

Referring to FIG. 13, a diagram illustrating measured drain current (IDD) plotted against control voltage VCTRL is shown. In one example, power-down operation may be specified at control voltages of between −0.5 V and +0.2 V, and power-up operation may be specified at voltages between 1.2 V and 3.5 V. The minimum drain current in power-down is approximately 4 mA. This is due to a residual current through the potential divider that biases the gate of the common gate enhancement-mode FET.

A cascode topology and measurements have been presented for a 50 MHz-2.7 GHz amplifier for broadcast applications. The amplifier exhibits gain of over 15 dB across the entire band and demonstrates best-in-class distortion performance. The problem of enhancement-mode FET variation is solved by using a common source depletion-mode FET and a common gate enhancement-mode FET which still enabled the use of a power-down circuit.

The functions and structures illustrated in the diagrams of FIGS. 1, and 4-6 may be designed, modeled and simulated using one or more of a conventional general purpose processor, digital computer, microprocessor, microcontroller and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors.

While the invention has been particularly shown and described with reference to the preferred embodiments thereof, it will be understood by those skilled in the art that various changes in form and details may be made without departing from the scope of the invention.

The invention claimed is:

1. An apparatus comprising:
   a first depletion-mode transistor having a common source configuration;
   a first enhancement-mode transistor having a common gate configuration, wherein said first depletion-mode transistor and said first enhancement-mode transistor are coupled in a cascade arrangement and a gate of said first enhancement-mode transistor is biased in response to a potential at a drain of said first enhancement-mode transistor; and
   a pull down switch operatively coupled between said gate of said first enhancement-mode transistor and a circuit ground.

2. The apparatus according to claim 1, wherein said pull down switch comprises a second enhancement-mode transistor having a source connected to said circuit ground and a drain connected to the gate of said first enhancement-mode transistor.

3. The apparatus according to claim 2, wherein said pull down switch further comprises:
   a second depletion-mode transistor; and
   a third enhancement-mode transistor, said third enhancement-mode transistor having a common source configuration and coupled with said second depletion-mode transistor to form an inverter, wherein an output of said inverter is coupled to a gate of said second enhancement-mode transistor.

4. The apparatus according to claim 1, wherein said apparatus is part of a broadband radio frequency (RF) amplifier.

5. The apparatus according to claim 4, wherein said pull down switch implements a current shutdown of said broadband RF amplifier.

6. The apparatus according to claim 1, wherein said first depletion-mode transistor and said first enhancement-mode transistor comprise field effect transistors (FETs).

7. The apparatus according to claim 1, wherein each of said first depletion-mode transistor and said first enhancement-mode transistor comprise a psuedomorphic high electron mobility transistor (pHEMT).

8. The apparatus according to claim 1, wherein said first depletion-mode transistor, said first enhancement-mode transistor, and said pull down switch are fabricated on a monolithic microwave integrated circuit (MMIC).

9. The apparatus according to claim 1, further comprising:
   a bias circuit configured to bias said gate of said first enhancement-mode transistor in response to said potential at said drain of said first enhancement-mode transistor.

10. The apparatus according to claim 1, further comprising:
    a passive potential divider circuit coupled to said drain and said gate of said first enhancement-mode transistor.

11. A method of implementing a broadband amplifier with current shutdown comprising:
    coupling a first depletion-mode transistor having a common source configuration to a first enhancement-mode transistor having a common gate configuration, wherein said first depletion-mode transistor and said first enhancement-mode transistor are coupled in a cascode arrangement and a gate of said first enhancement-mode transistor is biased in response to a potential at a drain of said first enhancement-mode transistor; and
    coupling a pull down switch between a gate of said first enhancement-mode transistor and a circuit ground.

12. The method according to claim 11, wherein said pull down switch comprises a second enhancement-mode transistor having a source connected to said circuit ground and a drain connected to the gate of said first enhancement-mode transistor.

13. The method according to claim 12, wherein said pull down switch further comprises:
    a second depletion-mode transistor; and
    a third enhancement-mode transistor, said third enhancement-mode transistor having a common source configuration and coupled with said second depletion-mode transistor to form an inverter, wherein an output of said inverter is coupled to a gate of said second enhancement-mode transistor.

14. The method according to claim 11, wherein said broadband amplifier comprises a radio frequency (RF) amplifier.

15. The method according to claim 14, wherein said pull down switch implements a current shutdown of said broadband RF amplifier.

16. The method according to claim 11, wherein said first depletion-mode transistor and said first enhancement-mode transistor are fabricated as part of a monolithic microwave integrated circuit (MMIC) using a psuedomorphic high electron mobility transistor (pHEMT) process.

17. The method according to claim 11, further comprising:
    coupling a passive potential divider circuit to said drain and said gate of said first enhancement-mode transistor.

18. An apparatus comprising:
    a first depletion-mode transistor having a common source configuration;
    a first enhancement-mode transistor having a common gate configuration, wherein said first depletion-mode transistor and said first enhancement-mode transistor are coupled in a cascade arrangement;
    a second enhancement-mode transistor having a source connected to a circuit ground and a drain connected to a gate of said first enhancement-mode transistor; and
    a third enhancement-mode transistor having a common source configuration and coupled with a second depletion-mode transistor to form an inverter, wherein an output of said inverter is coupled to a gate of said second enhancement-mode transistor.

19. The apparatus according to claim 18, wherein said apparatus is fabricated as an integrated circuit.

20. The apparatus according to claim 18, wherein each of said first depletion-mode transistor, said first enhancement-mode transistor, said second enhancement-mode transistor, and said third enhancement-mode transistor comprise a psuedomorphic high electron mobility transistor (pHEMT) and are fabricated on a monolithic microwave integrated circuit (MMIC).

* * * * *